United States Patent
Lee et al.

(10) Patent No.: US 12,382,667 B2
(45) Date of Patent: Aug. 5, 2025

(54) THIN FILM TRANSISTOR HAVING DUAL ACTIVE LAYERS WITH DUAL CHANNEL PORTIONS AND DISPLAY DEVICE COMPRISING THE SAME

(71) Applicant: LG Display Co., Ltd., Seoul (KR)

(72) Inventors: Dohyung Lee, Paju-si (KR); HongRak Choi, Paju-si (KR); ChanYong Jeong, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 499 days.

(21) Appl. No.: 17/978,100

(22) Filed: Oct. 31, 2022

(65) Prior Publication Data

US 2023/0146562 A1 May 11, 2023

(30) Foreign Application Priority Data

Nov. 9, 2021 (KR) ......................... 10-2021-0152695

(51) Int. Cl.
*H10D 30/67* (2025.01)
*H10K 59/121* (2023.01)
(Continued)

(52) U.S. Cl.
CPC ..... *H10D 30/6757* (2025.01); *H10K 59/1213* (2023.02); *H10K 59/126* (2023.02); *H10D 30/6723* (2025.01); *H10D 30/6734* (2025.01); *H10D 30/6755* (2025.01); *H10D 86/423* (2025.01); *H10D 86/60* (2025.01)

(58) Field of Classification Search
CPC .. H10D 30/01; H10D 30/031; H10D 30/0312; H10D 30/0327; H10D 30/501–509; H10D 30/6723; H10D 30/6733; H10D 30/6734; H10D 30/674; H10D 30/6755; H10D 30/6757; H10D 86/421; H10D 86/423; H10D 86/60;
(Continued)

(56) References Cited

U.S. PATENT DOCUMENTS 8,309,964 B2 11/2012 Kim
2009/0283763 A1 11/2009 Park et al.
(Continued)

FOREIGN PATENT DOCUMENTS

KR 10-1022141 B1 3/2011

OTHER PUBLICATIONS

Intellectual Property Office of the United Kingdom, Office Action, GB Patent Application No. 2214992.6, Apr. 3, 2023, four pages.
(Continued)

*Primary Examiner* — Cheung Lee
(74) *Attorney, Agent, or Firm* — Fenwick & West LLP

(57) ABSTRACT

A thin film transistor and a display device comprising the same are provided. The thin film transistor comprises a first gate electrode and a second gate electrode, which are spaced apart from each other to overlap each other, and an active layer disposed between the first gate electrode and the second gate electrode, including a first active layer and a second active layer, wherein the active layer includes a channel portion, a first connection portion that is in contact with one side of the channel portion, and a second connection portion that is in contact with the other side of the channel portion. The channel portion includes a first channel portion and a second channel portion, which are disposed in parallel.

25 Claims, 11 Drawing Sheets

(51) Int. Cl.
*H10K 59/126* (2023.01)
*H10D 86/40* (2025.01)
*H10D 86/60* (2025.01)

(58) Field of Classification Search
CPC .. H10K 59/12; H10K 59/1213; H10K 59/126; H10K 59/131; H10K 59/1315
See application file for complete search history.

(56) References Cited

U.S. PATENT DOCUMENTS

| | | |
|---|---|---|
| 2011/0095286 A1 | 4/2011 | Kim |
| 2015/0200305 A1 | 7/2015 | Kobayashi et al. |
| 2018/0114838 A1 | 4/2018 | Endo et al. |
| 2018/0190931 A1 | 7/2018 | Jung et al. |
| 2022/0190170 A1 | 6/2022 | Lee et al. |

OTHER PUBLICATIONS

German Patent and Trademark Office, Office Action, German Patent Application No. 102022128828.5, Jun. 1, 2023, 18 pages.

THIN FILM TRANSISTOR HAVING DUAL ACTIVE LAYERS WITH DUAL CHANNEL PORTIONS AND DISPLAY DEVICE COMPRISING THE SAME

CROSS-REFERENCE TO RELATED APPLICATIONS

This application claims the benefit of priority of the Republic of Korea Patent Application No. 10-2021-0152695 filed on Nov. 9, 2021, which is hereby incorporated by reference as if fully set forth herein.

BACKGROUND

Field

The present disclosure relates to a thin film transistor and a display device comprising the same, and more particularly, to a thin film transistor having a stacked structure and a selective double gate structure of some of active layers, and a display device comprising the same.

Discussion of the Related Art

Since a thin film transistor can be fabricated on a glass substrate or a plastic substrate, the thin film transistor is widely used as a switching device of a display device such as a liquid crystal display device or an organic light emitting device.

The thin film transistor may be categorized into an amorphous silicon thin film transistor in which amorphous silicon is used as an active layer, a polycrystalline silicon thin film transistor in which polycrystalline silicon is used as an active layer, and an oxide semiconductor thin film transistor in which an oxide semiconductor is used as an active layer, based on a material constituting the active layer.

Among the thin film transistors, since the oxide semiconductor thin film transistor (TFT) may have high carrier mobility and have a large resistance change in accordance with an oxygen content, it has an advantage in that desired properties may be easily obtained. Further, since an oxide constituting an active layer may be grown at a relatively low temperature during a process of fabricating the oxide semiconductor thin film transistor, the fabricating cost of the oxide semiconductor thin film transistor is reduced. In view of the properties of oxide, since an oxide semiconductor is transparent, it is favorable to embody a transparent display device.

A display device may include a switching thin film transistor and a driving thin film transistor. Generally, it is advantageous that the switching thin film transistor has a small subthreshold swing ("s-factor") to improve current on-off characteristics for use as a switch; while it is advantageous for the driving thin film transistor to have a large s-factor to express a gradual transition between low current and high current (sometimes referred to herein as "gray scale"). However, since thin film transistors generally have a small s-factor to improve on-off characteristics, when such thin film transistors are applied to the driving thin film transistor of the display device, it is difficult to express a gray scale.

The "s-factor" is a reciprocal value of a slope in the graph of the drain-source current $I_{DS}$ to the gate voltage $V_{GS}$ while the gate voltage, $V_{GS}$, is larger than 0 V and smaller than the threshold voltage Vth. It represents the rate at which $I_{DS}$ changes when $V_{GS}$ changes. An increased s-factor indicates a reduced (gradual) rate of change of $I_{DS}$ when $V_{GS}$ changes. Similarly, a decreased s-factor indicates an increased rate of change of $I_{DS}$ when $V_{GS}$ changes.

Therefore, a thin film transistor having a large s-factor is required to easily express a gray scale for use as a driving thin film transistor of the display device. Also, as well as having a large s-factor, it is important to increase the drain-source current in in an ON-state.

SUMMARY

The present disclosure has been made in view of the above problems and it is an object of the present disclosure to provide a thin film transistor that has a large s-factor, and has excellent current characteristics in an ON-state. In more detail, one example of the present disclosure is to provide a thin film transistor that has a large s-factor and has a large current value in an ON-state.

In particular, the provision of a thin film transistor having a double gate structure and a double active layer structure as claimed achieves a large s-factor and also achieves a high current in an ON-state. The thin film transistor therefore has excellent gray scale expression and is well suited for use as a driving transistor.

Additional objects and features of the present disclosure will be clearly understood by those skilled in the art from the following description of the present disclosure.

Disclosed herein is a thin film transistor comprising a first gate electrode and a second gate electrode, which are spaced apart from each other to overlap each other, and an active layer disposed between the first gate electrode and the second gate electrode, including a first active layer and a second active layer, wherein the active layer includes a channel portion, a first connection portion that is in contact with one side of the channel portion, and a second connection portion that is in contact with the other side of the channel portion, the channel portion includes a first channel portion and a second channel portion, which are disposed in parallel, the first channel portion and the second channel portion are extended from the first connection portion to the second connection portion, respectively, the first channel portion overlaps the first gate electrode and the second gate electrode, the second channel portion does not overlap the first gate electrode, and overlaps the second gate electrode, the second active layer is disposed in the first channel portion and the second channel portion, and the first active layer is made of a material having carrier mobility lower than that of the second active layer, and is not disposed in at least a portion of the second channel portion. In an N-type thin film transistor, carrier mobility may be electron mobility. However, the present disclosure is not limited to N-type thin film transistors. Herein, the channel portion may be defined as the portion of the active layer which overlaps with the second gate electrode.

The first active layer may be disposed between the first gate electrode and the second active layer.

The second active layer may have a mobility higher than that of the first active layer, for example a mobility which is double that of the first active layer, for example more than double that of the first active layer.

The first active layer may include a gallium (Ga)-based oxide semiconductor material.

The first active layer may include at least one of: an IGZO (InGaZnO)-based oxide semiconductor material, with the Ga concentration optionally being greater than or equal to the In concentration [Ga concentration≥In concentration]; a GZO (GaZnO)-based oxide semiconductor material; an IGO (InGaO)-based oxide semiconductor material; and a GZTO (GaZnSnO)-based oxide semiconductor material.

The second active layer may include at least one of: an IGZO (InGaZnO)-based oxide semiconductor material, with the Ga concentration optionally being less than the In concentration [Ga concentration<In concentration]; an IZO (InZnO)-based oxide semiconductor material; an ITZO (InSnZnO)-based oxide semiconductor material; an IGZTO (InGaZnSnO)-based oxide semiconductor material; a FIZO (FeInZnO)-based semiconductor material; a ZnO-based oxide semiconductor material; a SIZO(SiInZnO)-based oxide semiconductor material; and a ZnON (Zn-Oxynitride)-based oxide semiconductor material.

The first active layer may cover the entire first gate electrode in an area overlapped with the channel portion.

The first active layer may not be disposed in the second channel portion.

A surface of the second active layer, which faces the first gate electrode, may be fully covered by the first active layer in the channel portion.

A ratio of a width of the first channel portion to a width of the second channel portion may range from 3:7 to 7:3.

The second active layer may include a first oxide semiconductor layer, and a second oxide semiconductor layer on the first oxide semiconductor layer.

Also disclosed herein is a display device comprising a pixel driving circuit, and a display element connected to the pixel driving circuit, wherein the pixel driving circuit includes a first thin film transistor and a second thin film transistor, and the first thin film transistor is the above thin film transistor.

The second thin film transistor may include at least one of an active layer made of the same material as that of the first active layer or an active layer made of the same material as that of the second active layer.

The second thin film transistor may include a gate electrode disposed on the same layer as the second gate electrode, and may not include a gate electrode disposed on the same layer as the first gate electrode.

The first thin film transistor may be a driving transistor, and the second thin film transistor may be a switching transistor.

BRIEF DESCRIPTION OF THE DRAWINGS

The above and other objects, features and other advantages of the present disclosure will be more clearly understood from the following detailed description taken in conjunction with the accompanying drawings.

DETAILED DESCRIPTION

Figure 1A:
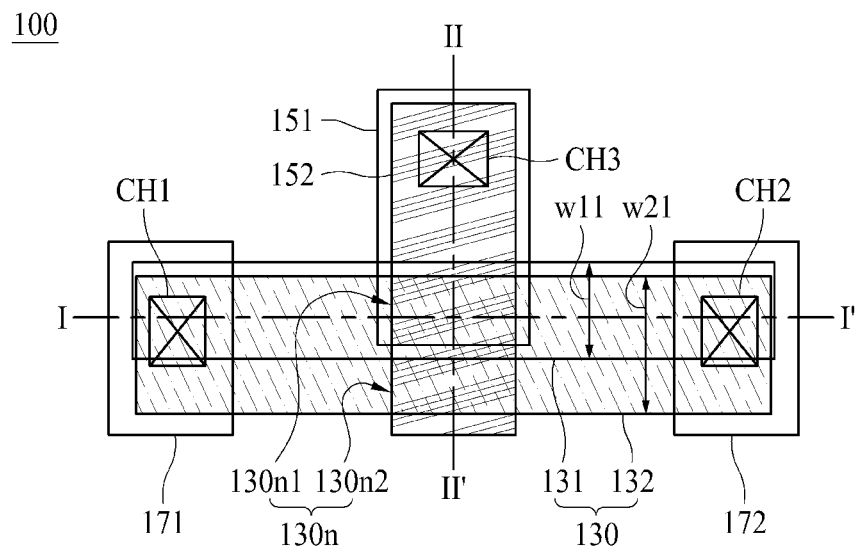
FIG. 1A is a plan view illustrating a thin film transistor according to one example of the present disclosure.

Advantages and features of the present disclosure, and implementation methods thereof will be clarified through following examples described with reference to the accompanying drawings. The present disclosure may, however, be embodied in different forms and should not be construed as limited to the examples set forth herein. Rather, these examples are provided so that this disclosure will be thorough and complete, and will fully convey the scope of the present disclosure to those skilled in the art.

A shape, a size, a ratio, an angle, and a number disclosed in the drawings for describing examples of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~%' 'above', 'below~%' and 'next to~', one or more portions may be arranged between two other portions unless 'just' or 'direct' is used.

Spatially relative terms such as "below", "beneath", "lower", "above", and "upper" may be used herein to easily describe a relationship of one element or elements to another element or elements as illustrated in the figures. It will be understood that these terms are intended to encompass different orientations of the device in addition to the orientation depicted in the figures. For example, if the device illustrated in the figure is reversed, the device described to be arranged "below", or "beneath" another device may be arranged "above" another device. Therefore, an exemplary term "below or beneath" may include "below or beneath" and "above" orientations. Likewise, an exemplary term "above" or "on" may include "above" and "below or beneath" orientations.

In describing a temporal relationship, for example, when the temporal order is described as "after," "subsequent," "next," and "before," a case which is not continuous may be included, unless "just" or "direct" is used.

It will be understood that, although the terms "first", "second", etc. may be used herein to describe various elements, these elements should not be limited by these terms. These terms are only used to partition one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Where a thickness direction is referred to herein, it is to be understood as a direction perpendicular to the plane of the substrate (e.g. base substrate 110) on which the transistor is grown/disposed. Where a "plan view" is referred to herein, it is to be understood as a view taken along (i.e. in a direction parallel to) the thickness direction. Where a first component is said to "cover" a second component herein, it is to be understood that the first component is positioned to cover the second component in plan view. Where the first component is said to "fully cover" the second component herein, it is to be understood that the first component is positioned to completely cover the second component in plan view, such that the second component is completely obstructed from view by the first component in plan view. Where a first component is said to "overlap" a second component herein, it is to be understood that the overlapping is observed in plan view. Where a first component is said to be "on" or "disposed on" a second component herein, it is to be understood as a stacking of the first and second components in the thickness direction, optionally with no intervening layer(s). Where a first axis is referred to herein, it is to be understood as being parallel to the left-right direction in FIG. 1A, i.e. parallel to a straight line drawn from the first contact hole CH1 to the second contact hole CH2 in FIG. 1A. Where a second axis is referred to herein, it is to be understood as being parallel to the up-down direction in FIG. 1A, i.e. perpendicular to the first axis. Where a "length" is defined herein, it is to be understood as a distance measured parallel to the first axis. Where a "width" is defined herein, it is to be understood as a distance measured parallel to the second axis.

Features of various examples of the present disclosure may be partially or overall coupled to or combined with each other, and may be variously inter-operated with each other and driven technically as those skilled in the art can sufficiently understand. The examples of the present disclosure may be carried out independently from each other, or may be carried out together in co-dependent relationship.

In the drawings, the same or similar elements are denoted by the same reference numerals even though they are depicted in different drawings.

In the examples of the present disclosure, a source electrode and a drain electrode are distinguished from each other, for convenience of description. However, the source electrode and the drain electrode may be used interchangeably. The source electrode may be the drain electrode, and the drain electrode may be the source electrode. Also, the source electrode in any one example of the present disclosure may be the drain electrode in another example of the present disclosure, and the drain electrode in any one example of the present disclosure may be the source electrode in another example of the present disclosure.

In some examples of the present disclosure, for convenience of description, a source region is distinguished from a source electrode, and a drain region is distinguished from a drain electrode. However, the examples of the present disclosure are not limited to this structure. For example, a source region may be a source electrode, and a drain region may be a drain electrode. Also, a source region may be a drain electrode, and a drain region may be a source electrode.

Figure 1B:
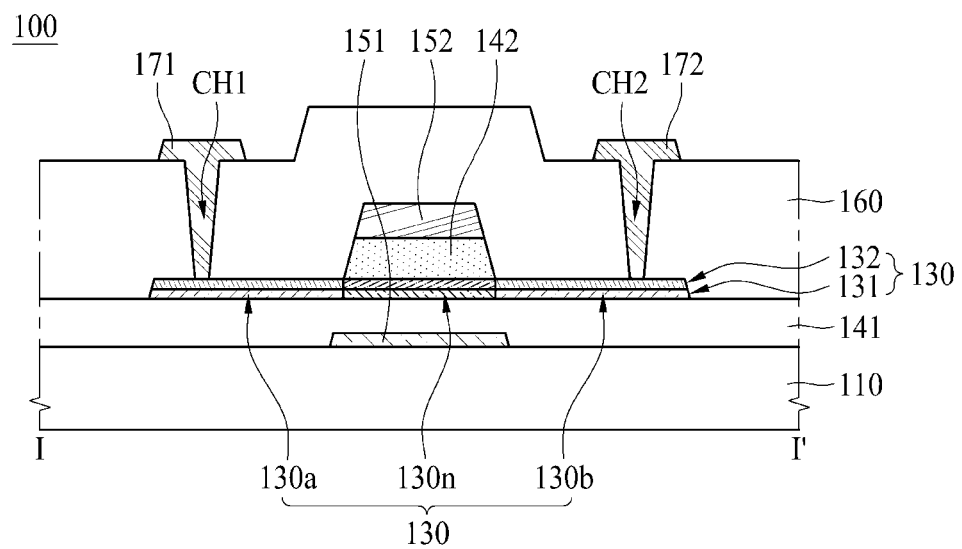
FIG. 1B is a cross-sectional view taken along line I-I' of FIG. 1A according to one embodiment of the present disclosure.
Figure 1C:
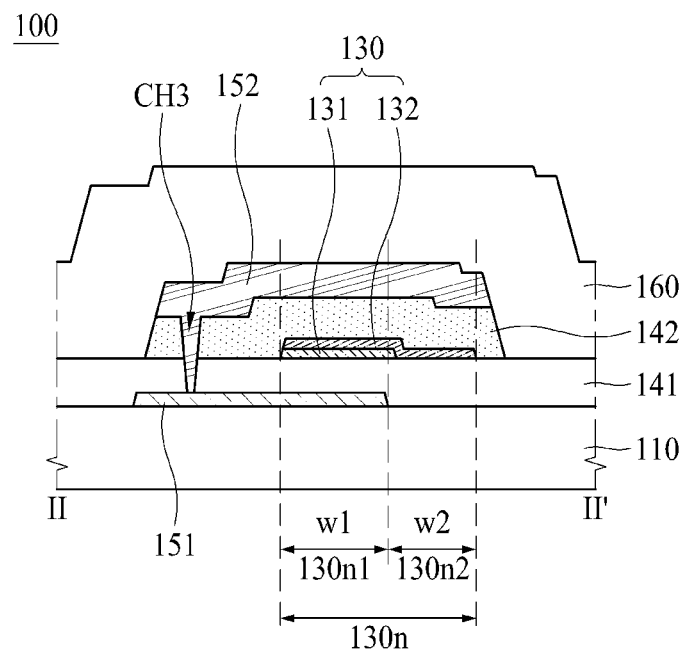
FIG. 1C is a cross-sectional view taken along line II-II' of FIG. 1A according to one embodiment of the present disclosure.

FIG. 1A is a plan view illustrating a thin film transistor according to one example of the present disclosure, FIG. 1B is a cross-sectional view taken along line I-I' of FIG. 1A according to an embodiment of the present disclosure, and FIG. 1C is a cross-sectional view taken along line II-II' of FIG. 1A according to an embodiment of the present disclosure.

Referring to FIGS. 1A, 1B and 1C, a thin film transistor 100 according to one example of the present disclosure includes a first gate electrode 151 and a second gate electrode 152, which are spaced apart from each other to overlap each other, and an active layer 130 disposed between the first gate electrode 151 and the second gate electrode 152. The active layer 130 includes a first active layer 131 and a second active layer 132.

Referring to FIG. 1B, the thin film transistor 100 is disposed on a base substrate 110.

Glass or plastic may be used as the base substrate 110. A transparent plastic having a flexible property, for example, polyimide may be used as the plastic. When polyimide is used as the base substrate 110, a heat-resistant polyimide capable of enduring a high temperature may be used considering that a high temperature deposition process is performed on the base substrate 110.

Figure 3:
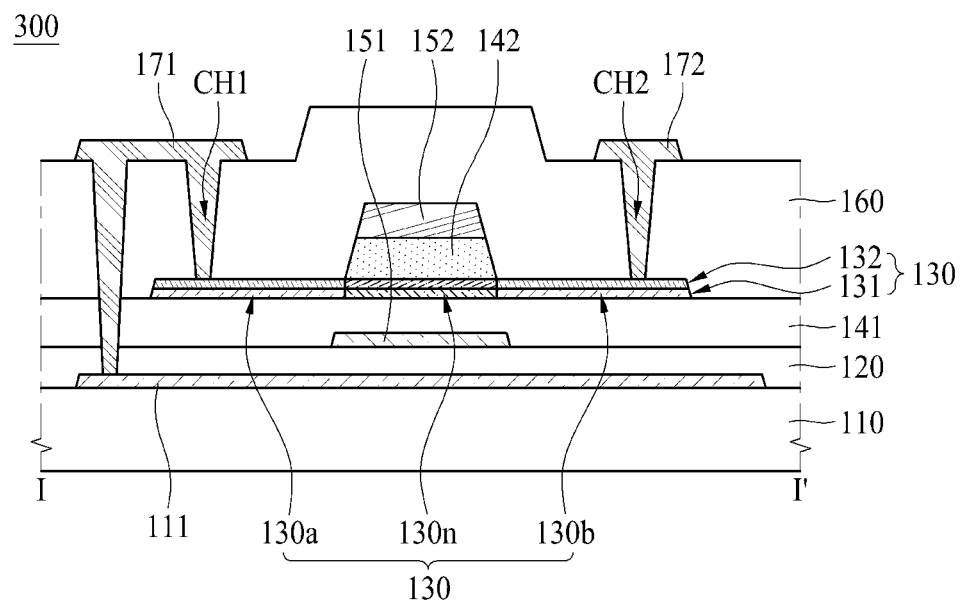
FIG. 3 is a cross-sectional view illustrating a thin film transistor according to still another example of the present disclosure.

Although not shown in FIGS. 1B and 1C, a buffer layer may be disposed on the base substrate 110 (see FIG. 3). The buffer layer protects the active layer 130. An upper surface of the base substrate 110 may be uniform by the buffer layer.

A first gate electrode 151 is disposed on the base substrate 110.

The first gate electrode 151 may include at least one of an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), neodymium (Nd) or titanium (Ti). The first gate electrode 151 may have a multi-layered structure that includes at least two conductive layers having their respective physical properties different from each other.

A first gate insulating layer 141 is disposed on the first gate electrode 151. The first gate insulating layer 141 protects the active layer 130.

The first gate insulating layer 141 may include at least one of a silicon oxide, a silicon nitride or a metal-based oxide. The first gate insulating layer 141 may have a single layered structure, or may have a multi-layered structure. According to one example of the present disclosure, the first gate insulating layer 141 may serve as a buffer layer for blocking oxygen ($O_2$) or moisture ($H_2O$) permeated from the base substrate. To this end, the first gate insulating layer 141 may be made of an oxide such as a silicon oxide.

Referring to FIGS. 1B and 1C, the first gate insulating layer 141 may be disposed on an entire surface on the base substrate 110 without being patterned.

The active layer 130 is disposed on the first gate insulating layer 141.

The active layer 130 may include a semiconductor material. According to one example of the present disclosure, the active layer 130 may include an oxide semiconductor material.

According to one example of the present disclosure, the active layer 130 includes a channel portion 130n, a first connection portion 130a and a second connection portion 130b. The first connection portion 130a is in contact with one side of the channel portion 130n and extends from the one side of the channel portion 130n along the first axis; and the second connection portion 130b is in contact with the other side of the channel portion 130n, and extends from the other side of the channel portion 130n along the first axis.

The first connection portion 130a and the second connection portion 130b may be formed by selective conductorization for the active layer 130. Herein, "conductorization" means making part of the active layer (i.e. the selected part) conductive. In practice, this may be achieved by a reduction of the selected part of the active layer 130, so that oxygen vacancy is introduced in the selected part of the active layer 130, thereby increasing conductivity of the selected part of the active layer. Thus, the first connection portion 130a and second connection portion 130b may be conductive. The first connection portion 130a and the second connection portion 130b may therefore also referred to as conductorization portions. According to one example of the present disclosure, the first connection portion 130a of the active layer 130 may be a source area, and the second connection portion 130b may be a drain area, but one example of the present disclosure is not limited thereto, and the first connection portion 130a may be a drain area, and the second connection portion 130b may be a source area.

According to one example of the present disclosure, the active layer 130 includes a first active layer 131 and a second active layer 132. The second active layer 132 may be disposed on the first active layer 131, so as to at least partially overlap the first active layer 131.

According to one example of the present disclosure, the first active layer 131 may be made of a material having mobility lower than that of the second active layer 132. For example, the second active layer 132 may have mobility higher than that of the first active layer 131 as much as twice or more. In more detail, the second active layer 132 may have mobility of 2 to 5 times higher than that of the first active layer 131.

A threshold voltage Vth of the thin film transistor 100 may be shifted in a positive (+) direction by the first active layer 131 having relatively low mobility. Also, the threshold voltage Vth of the thin film transistor 100 may be shifted in a negative (−) direction by the second active layer 132 having relatively high mobility. The first active layer 131 is designed to be affected by the first gate electrode 151 (it faces the first gate electrode 151), and the second active layer 132 is designed to be affected by the second gate electrode 152 (it faces the second gate electrode 152). Since the first active layer 131 and the second active layer 132 overlap each other, an s-factor of the thin film transistor 100 may therefore be increased (see FIGS. 5A and 5B). The s-factor will be described later.

The first active layer 131 may be made of a low mobility oxide semiconductor material. For example, the first active layer 131 may include a gallium (Ga)-based oxide semiconductor material. The first active layer 131 that includes a gallium (Ga)-based oxide semiconductor material may have relatively low mobility, and may have a stable film structure.

According to one example of the present disclosure, the first active layer 131 may include at least one of an IGZO (InGaZnO)-based oxide semiconductor material [Ga concentration≥In concentration], a GZO (GaZnO)-based oxide semiconductor material, an IGO (InGaO)-based oxide semiconductor material, or a GZTO (GaZnSnO)-based oxide semiconductor material, but one example of the present disclosure is not limited thereto, and the first active layer 131 may be formed by another low mobility oxide semiconductor material known in the art.

Among elements constituting an oxide semiconductor, indium (In) is known as an element for improving mobility of a semiconductor layer or an active layer. Therefore, when the first active layer 131 includes indium, a content of indium (In) may be set to be smaller than or equal to that of gallium (Ga) based on the number of moles.

The second active layer 132 may be made of a high mobility oxide semiconductor material. For example, the second active layer 132 may include an indium (In)-based or zinc (Zn)-based oxide semiconductor material.

According to one example of the present disclosure, the second active layer 132 may include at least one of an IGZO (InGaZnO)-based oxide semiconductor material [Ga concentration<In concentration], an IZO (InZnO)-based oxide semiconductor material, an IGZTO (InGaZnSnO)-based oxide semiconductor material, an ITZO (InSnZnO)-based oxide semiconductor material, a FIZO (FeInZnO)-based semiconductor material, a ZnO-based oxide semiconductor material, a SIZO(SiInZnO)-based oxide semiconductor material, or a ZnON (Zn-Oxynitride)-based oxide semiconductor material.

The gallium (Ga) may degrade mobility of the oxide semiconductor. Therefore, when the indium (In)-based oxide semiconductor constituting the second active layer 132 includes gallium (Ga), the content of indium (In) may be set to be greater than that of gallium (Ga) based on the number of moles.

Referring to FIGS. 1A, 1B, and 1C, the second active layer 132 is disposed on the first active layer 131 so as to contact the first active layer 131. The second active layer 132 may cover the first active layer 131. According to one example of the present disclosure, the first active layer 131 is disposed between the first gate electrode 151 and the second active layer 132.

According to one example of the present disclosure, a width w21 of the second active layer 132 is greater than a width w11 of the first active layer 131. For example, the width w11 of the first active layer 131 may be 30% to 70% of the width w21 of the second active layer 132 (0.3≤w11/w21≤0.7).

Figure 1D:
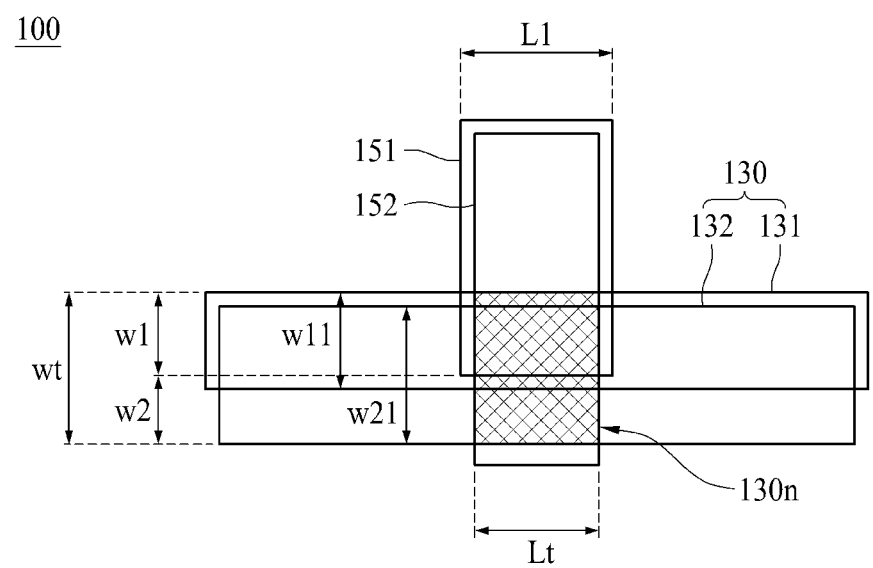
FIG. 1D is a detailed view illustrating a channel portion of a thin film transistor according to one example of the present disclosure.

FIG. 1D is a detailed view illustrating the channel portion 130n of the thin film transistor 100 according to one example of the present disclosure (the area of the channel portion 130n being illustrated with cross-hatched lines in FIG. 1D). According to one example of the present disclosure, the first active layer 131 may have a width w11 and may cover at least the first gate electrode 151 in the channel area 130n. In detail, referring to FIG. 1D, the channel portion 130n is an area defined by a length Lt and a width wt. On a plan view, the width of the first active layer 131 may be defined as "w11". A width of the portion of the first gate electrode 151 which overlaps the channel portion 130n, is equal to "w1", with w1 being defined herein as a width of a first channel portion 130n1. Referring to FIG. 1D, the width w11 of the first active layer 131 is greater than the width w1 of the area of the first gate electrode 151 which overlaps the channel portion 130n (w11>w1). Referring to FIGS. 1A and 1D, a length of the first active layer 131 is greater than a length L1 of the first gate electrode 151. Therefore, on the plane, the first active layer 131 may cover at least the first gate electrode 151 in the area of the channel portion 130n. Therefore, an electric field generated by the first gate electrode 151 may be blocked by the first active layer 131, so that the electric field may not affect the second active layer 132 or its influence may be reduced or minimized.

A second gate insulating layer 142 is disposed on the active layer 130. The second gate insulating layer 142 protects the channel portion 130n.

The second gate insulating layer 142 may include at least one of a silicon oxide, a silicon nitride or a metal-based oxide. The second gate insulating layer 142 may have a single layered structure, or may have a multi-layered structure.

Referring to FIGS. 1B and 1C, the second gate insulating layer 142 may have a patterned structure. In the process of patterning the second gate insulating layer 142, the active layer 130 may be selectively conductorized so that the first connection portion 130a and the second connection portion 130b may be formed, but one example of the present disclosure is not limited thereto, and the second gate insulating layer 142 may be disposed on the entire surface of the base substrate 110 without being patterned (see FIG. 2).

The second gate electrode 152 is disposed on the second gate insulating layer 142. The second gate electrode 152 overlaps the channel portion 130n of the active layer 130.

The second gate electrode 152 may include at least one of an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), neodymium (Nd) or titanium (Ti). The second gate electrode 152 may have a multi-layered structure that includes at least two conductive layers having their respective physical properties different from each other. The second gate electrode 152 may be made of the same material as that of the first gate electrode 151, or may be made of a material different from that of the first gate electrode 151.

According to one example of the present disclosure, the second gate insulating layer 142 may be patterned by an etching process using the second gate electrode 152 as a mask. In this process, the active layer 130 may be selectively conductorized to form the first connection portion 130a and the second connection portion 130b. In more detail, according to one example of the present disclosure, an area of the active layer 130, which overlaps the second gate electrode 152, is not conductorized, and thus may become the channel portion 130n having semiconductor characteristics, and an area of the active layer 130, which does not overlap the second gate electrode 152, may be conductorized, and thus may become the first connection portion 130a and the second connection portion 130b.

Referring to FIGS. 1A and 1C, the first gate electrode 151 and the second gate electrode 152 are spaced apart from each other in the thickness direction, with the active layer 130 interposed therebetween, and may be connected to each other by a contact hole CH3 in an outer area of the active layer 130.

According to one example of the present disclosure, the same voltage may be applied to the first gate electrode 151 and the second gate electrode 152. The voltage applied to the first gate electrode 151 and the second gate electrode 152 is referred to as a gate voltage.

According to one example of the present disclosure, the active layer 130 is disposed between the first gate electrode 151 and the second gate electrode 152, and the channel portion 130n may be defined as the part of the active layer 130 which is covered by the second gate electrode 152 in plan view. The channel portion 130n thus overlaps with the second gate electrode 152, and the area of the channel portion 130n which overlaps with the first gate electrode 151 in addition to the second gate electrode 152, is defined as the first channel portion 130n1. The area of the channel portion 130n which overlaps with the second gate electrode 152 but does not overlap with the first gate electrode 151, is defined as a second channel portion 130n2.

Referring to FIG. 1A, the channel portion 130n may include a first channel portion 130n1 and a second channel portion 130n2, which are disposed side-by-side (for example, in parallel to one another). Each of the first channel portion 130n1 and the second channel portion 130n2 extends from the first connection portion 130a to the second connection portion 130b. The first channel portion 130n1 overlaps the first gate electrode 151 and the second gate electrode 152. The second channel portion 130n2 overlaps the second gate electrode 152 without overlapping the first gate electrode 151.

According to one example of the present disclosure, the second active layer 132 is disposed over the first channel portion 130n1 and the second channel portion 130n2. The first active layer 131 is not disposed in at least a portion of the second channel portion 130n2.

Referring to FIGS. 1A and 1C, the first active layer 131 may cover the entire first gate electrode 151 in the area overlapped with the channel portion 130n. In more detail, the first gate electrode 151 may be designed to face only the first active layer 131 in the channel portion 130n. Therefore, when a voltage is applied to the first gate electrode 151 and the second gate electrode 152, an electric field effect generated by the first gate electrode 151 may be applied to the first active layer 131, and an electric field effect generated by the second gate electrode 152 may be applied to the second active layer 132.

According to one example of the present disclosure, the first gate electrode 151 faces the first channel portion 130n1, and a portion of the first channel portion 130n1, which faces the first gate electrode 151, may include the first active layer 131. In detail, a lower portion of the first channel portion 130n1, which is affected by the electric field effect by the first gate electrode 151, may comprise the first active layer 131 having low mobility characteristics. As a result, the threshold voltage of the thin film transistor 100 may be shifted in the positive (+) direction by the lower portion of the first channel portion 130n, which is affected by the first gate electrode 151.

In detail, the channel portion 130n may include a first channel portion 130n1 formed in the first active layer 131. According to one example of the present disclosure, the field effect caused by the first gate electrode 151 is applied to only the first channel portion 130n1 formed in the first active layer 131, so that the threshold voltage of the thin film transistor 100 may be shifted in the positive (+) direction.

The second active layer 132 having high carrier mobility characteristics has poor interface characteristics with an insulating layer such as the first gate insulating layer 141, particularly an oxide-based insulating layer. According to one example of the present disclosure, the first gate insulating layer 141 may serve as a buffer layer for blocking oxygen ($O_2$) or moisture ($H_2O$) permeated from the base substrate 110, and thus may be made of an oxide such as silicon oxide. In this case, when the second active layer 132 is in contact with the first gate insulating layer 141, a charge trap may be generated on an interface between the second active layer 132 and the first gate insulating layer 141, whereby the threshold voltage of the thin film transistor 100 may be changed to be unstable. When the electric field effect is applied to the second active layer 132 having high mobility characteristics, particularly to the lower surface of the second active layer 132, which is in contact with the first gate insulating layer 141, the threshold voltage of the thin film transistor 100 may not be uniform and its driving may be unstable.

Therefore, according to one example of the present disclosure, in order to prevent the electric field effect generated by the first gate electrode 151 from being applied to the lower surface of the second active layer 132, the first active layer 131 may be designed to fully cover the first gate electrode 151 in the channel portion 130n. To this end, as shown in FIGS. 1A, 1C and 1D, the first active layer 131 may be extended from a first channel portion 130n1, which is defined as the portion of the channel portion 130n which covers the first gate electrode 151, to a portion of a second channel portion 130n2.

Figure 1E:
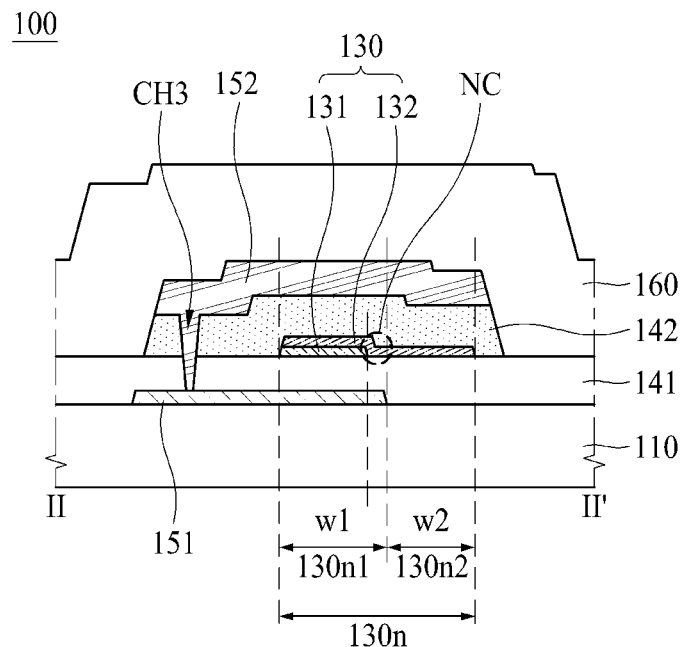
FIG. 1E is a cross-sectional view illustrating a channel portion of a thin film transistor according to a comparative example.

FIG. 1E is a cross-sectional view illustrating a channel portion 130n of a thin film transistor according to a comparative example. As shown in FIG. 1E, when the first active layer 131 fails to cover the entire first gate electrodes 151 in the channel portion 130n, a portion NC of the second active layer 132 faces the first gate electrode 151. As a result, the electric field effect generated by the first gate electrode 151 may be directly applied to the lower portion of the second active layer 132, whereby a problem such as a charge trap may occur on the interface of the second active layer 132 and the first gate insulating layer 141. In this case, driving stability of the thin film transistor may be deteriorated.

The arrangement structure of the first active layer 131 shown in FIGS. 1A, 1C and 1D considers a process error, and one example of the present disclosure is not limited thereto. When a precise process may be performed without an error, the first active layer 131 may completely cover the first gate electrode 151 in the channel portion 130n, and may be designed so as not to be disposed in the second channel portion 130n2.

Referring to FIGS. 1A, 1B and 1C, the second active layer 132 faces the second gate electrode 152. The second active layer 132 may be designed such that its surface facing the first gate electrode 151 may be fully covered by the first active layer 131 in the channel portion 130n. In detail, the second active layer 132 may be designed to directly face the second gate electrode 152 with the second gate insulating layer 142 interposed therebetween, but not to directly face the first gate electrode 151 with the first gate insulating layer 141 interposed therebetween.

When the portion of the second active layer 132 which faces the first gate electrode 151, is fully covered by the first active layer 131 in the channel portion 130n (that is, where the first active layer 131 is interposed between the second active layer 132 and the first gate electrode 151), the second active layer 132 is not affected by the electric field by the first gate electrode 151. As a result, the threshold voltage of the thin film transistor 100 may be prevented from being unstable.

In the second channel portion 130n2, the second active layer 132 is affected by the electric field by the second gate electrode 152, and has high mobility. In particular, the second channel portion 130n2, which is formed of the second active layer 132, has only high mobility characteristics, so that the threshold voltage of the thin film transistor 100 is shifted in the negative (−) direction (see FIG. 5A).

As a result, according to one example of the present disclosure, the first channel portion 130n1 for allowing the threshold voltage to be shifted in the positive (+) direction and the second channel portion 130n2 for allowing the threshold voltage to be shifted in the negative (−) direction are disposed in parallel, whereby the s-factor of the thin film transistor 100 may be increased.

Also, when the thin film transistor 100 is turned on, charges may be mainly shifted through the second active layer 132, which directly faces the second gate electrode 152 and has high mobility characteristics. As a result, current characteristics of the thin film transistor 100 may be improved in an ON-state.

According to one example of the present disclosure, a ratio of the width w1 of the first channel portion 130n1 to a width w2 of the second channel portion 130n2 may range from 3:7 to 7:3. When the width w1 of the first channel portion 130n1 is less than 30% of the total width (w1+w2) of the channel portion 130n, the effect of the threshold voltage shifted in the positive (+) direction is deteriorated, whereby the effect of improving the s-factor of the thin film transistor 100 may not be large. On the other hand, when the width w1 of the first channel portion 130n1 exceeds 70% of the total width (w1+w2) of the channel portion 130n, the width w2 of the second channel portion 130n2 becomes narrow, so that the effect of shifting the threshold voltage in the negative (−) direction is deteriorated. As a result, the effect of improving the s-factor of the thin film transistor 100 may not be large.

In more detail, the ratio of the width w1 of the first channel portion 130n1 to the width w2 of the second channel portion 130n2 may range from 4:6 to 6:4, or may range from 4.5:5.5 to 5.5:4.5.

Referring to FIGS. 1B and 1C, an interlayer insulating layer 160 may be disposed on the second gate electrode 152. The interlayer insulating layer 160 may be made of an organic or inorganic insulating material. The interlayer insulating layer 160 may be formed of a composite layer of an organic layer and an inorganic layer.

The thin film transistor 100 according to one example of the present disclosure may include a first electrode 171 and a second electrode 172, which are disposed on the interlayer insulating layer 160. The first electrode 171 may serve as a source electrode, and the second electrode 172 may serve as a drain electrode, but one example of the present disclosure is not limited thereto. The first electrode 171 may serve as a drain electrode, and the second electrode 172 may serve as a source electrode. In addition, the first connection portion 130a and the second connection portion 130b may serve as a source electrode and a drain electrode, respectively, and the first electrode 171 and the second electrode 172 may serve as connection electrodes between the elements.

Referring to FIGS. 1A and 1B, each of the first electrode 171 and the second electrode 172 may be connected to the active layer 130 through contact holes CH1 and CH2. In detail, the first electrode 171 may be in contact with the first connection portion 130a through the contact hole CH1. The second electrode 172 may be spaced apart from the first electrode 171, and thus may be in contact with the second connection portion 130b through the contact hole CH2.

Figure 2:
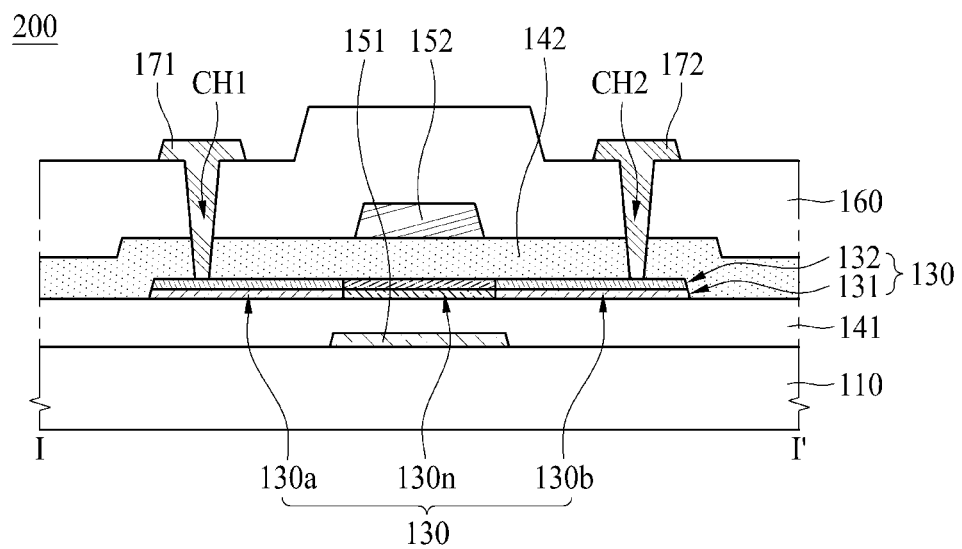
FIG. 2 is a cross-sectional view illustrating a thin film transistor according to another example of the present disclosure.

FIG. 2 is a cross-sectional view illustrating a thin film transistor 200 according to another example of the present disclosure. Hereinafter, the description of the elements that are already described will be omitted to avoid redundancy.

In comparison with the thin film transistor 100 of FIGS. 1A to 1C, the thin film transistor 200 of FIG. 2 includes a second gate insulating layer 142 that is not patterned. As shown in FIG. 2, the second gate insulating layer 142 may not be patterned.

When the second gate insulating layer 142 is not patterned, the active layer 130 may be selectively conductorized by selective ion doping, selective hydrogen implantation or selective ultraviolet irradiation, so that the first connection portion 130a and the second connection portion 130b may be formed.

FIG. 3 is a cross-sectional view illustrating a thin film transistor 300 according to still another example of the present disclosure.

Referring to FIG. 3, a light shielding layer 111 may be disposed on the base substrate 110. The light shielding layer 111 may be made of a material having light shielding characteristics. The light shielding layer 111 shields light incident from the outside to protect the active layer 130.

Although not shown in FIG. 3, a lower buffer layer may be disposed between the base substrate 110 and the light shielding layer 111.

Referring to FIG. 3, a buffer layer 120 may be disposed on the light shielding layer 111. The buffer layer 120 may include at least one of a silicon oxide, a silicon nitride or a metal-based oxide. The buffer layer 120 protects the active layer 130. Also, an upper surface of the base substrate 110 on which the light shielding layer 111 is disposed may be uniform by the buffer layer 120.

Referring to FIG. 3, other elements of the thin film transistor 300 that includes the first gate electrode 151 may be disposed on the buffer layer 120.

Figure 4:
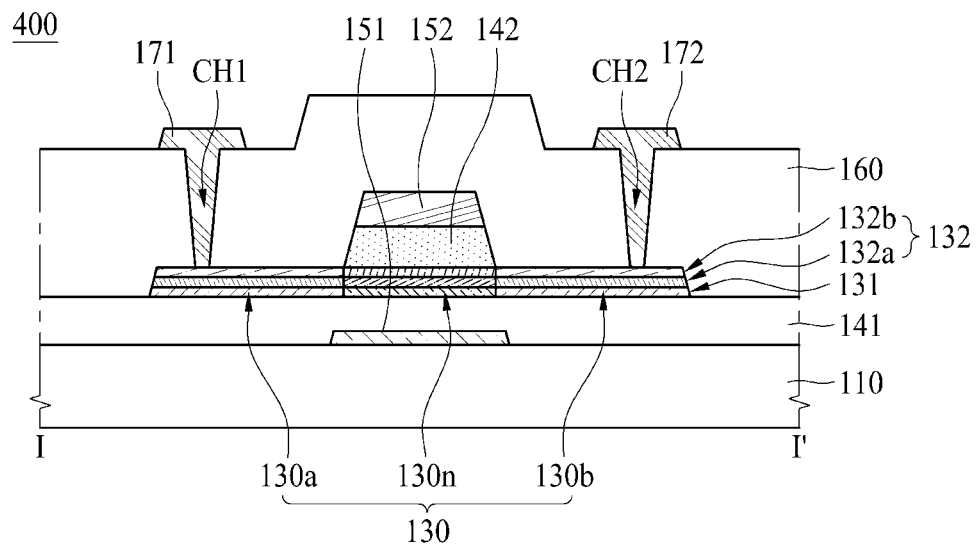
FIG. 4 is a cross-sectional view illustrating a thin film transistor according to further still another example of the present disclosure.

FIG. 4 is a cross-sectional view illustrating a thin film transistor 400 according to further still another example of the present disclosure.

In the thin film transistor 400 of FIG. 4, the second active layer 132 may have a multi-layered structure as compared with the thin film transistor 100 of FIG. 1B.

Referring to FIG. 4, the second active layer 132 may include a first oxide semiconductor layer 132a and a second oxide semiconductor layer 132b on the first oxide semiconductor layer 132a. Both the first oxide semiconductor layer 132a and the second oxide semiconductor layer 132b may have high mobility characteristics.

However, further still another example of the present disclosure is not limited to the above example.

The first oxide semiconductor layer 132a and the second oxide semiconductor layer 132b may include the same semiconductor material, and may include their respective semiconductor materials different from each other. The first active layer 131 may also have a multi-layered structure. For example, the first active layer 131 may have a structure in which a plurality of semiconductor layers made of different oxide semiconductor materials having low mobility characteristics are stacked.

Figure 5A:
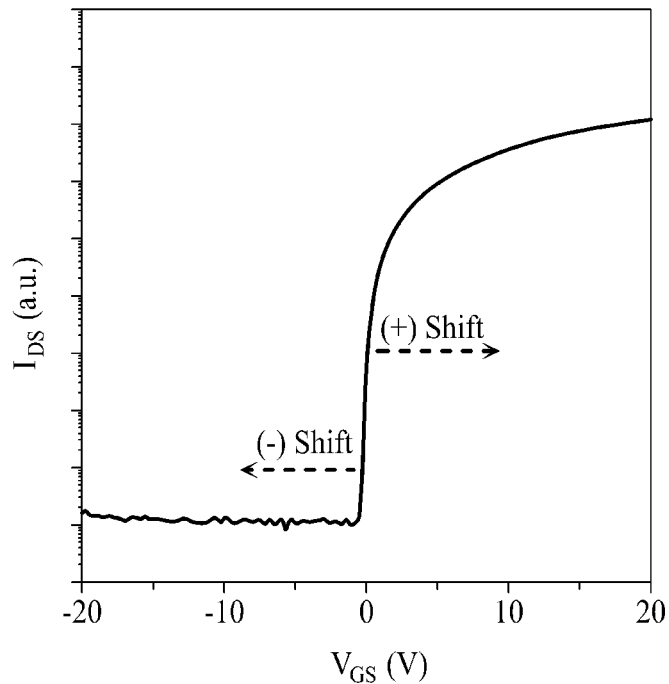
FIGS. 5A and 5B are graphs illustrating threshold voltages for thin film transistors.
Figure 5B:
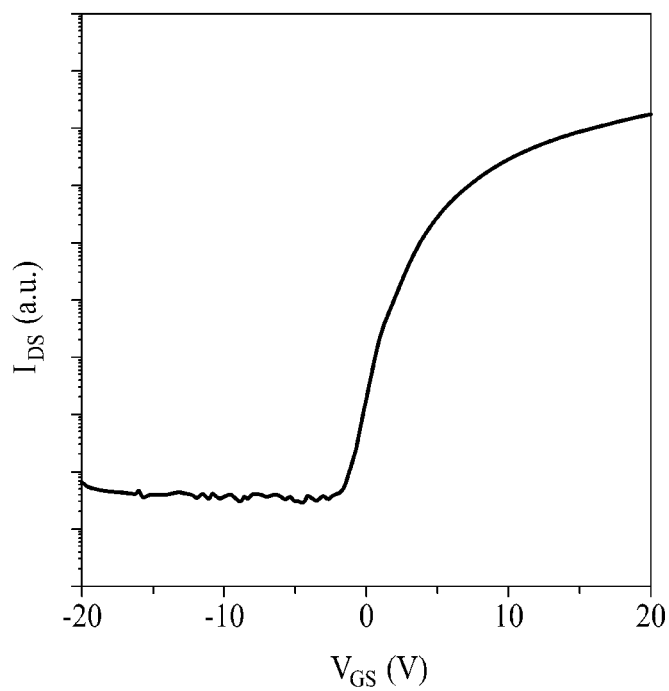

FIGS. 5A and 5B are threshold voltage graphs for thin film transistors. In detail, FIG. 5A is a threshold voltage graph of a thin film transistor generally used as a switching element, and FIG. 5B is a threshold voltage graph of the thin film transistor 100 according to one example of the present disclosure.

The threshold voltage graph for thin film transistors is represented by a graph of a drain-source current $I_{DS}$ for a gate voltage $V_{GS}$ FIGS. 5A and 5B show the drain-source current $I_{DS}$ for the gate voltage $V_{GS}$. In FIGS. 5A and 5B, a reciprocal value of the slope of the graph of the drain-source current $I_{DS}$ for the gate voltage $V_{GS}$ is an s-factor. When a slope of the graph is sharp, the s-factor is small, and when the slope of the graph is gentle, the s-factor is large. When the s-factor is large, a change rate of the drain-source current $I_{DS}$ for the gate voltage at the period of the threshold voltage Vth is slow.

When the s-factor becomes large, since the change rate of the drain-source current $I_{DS}$ for the gate voltage at the period of the threshold voltage Vth becomes slow, it is easy to adjust a magnitude of the drain-source current $I_{DS}$ by adjusting the gate voltage $V_{GS}$. In the display device driven by the current, for example, in an organic light emitting display device, a gray scale of a pixel may be controlled by adjusting the magnitude of the drain-source current $I_{DS}$ of the driving thin film transistor. The magnitude of the drain-source current $I_{DS}$ of the driving thin film transistor is determined by the gate voltage. Therefore, in the organic light emitting display device driven by the current, it is easy to adjust a gray scale of a pixel as the s-factor of the driving thin film transistor TR becomes large.

As shown in FIG. 5A, in the threshold voltage graph of the thin film transistor generally used as the switching element, when the threshold voltage is shifted in the positive (+) direction in an area of a voltage greater than 0 V and the threshold voltage is shifted in the negative (−) direction in an area of a voltage less than 0 V, the slope of the graph of the drain-source current $I_{DS}$ for the gate voltage $V_{GS}$ may become slow at the period of the threshold voltage Vth.

In the thin film transistor 100 according to one example of the present disclosure, the threshold voltage may be shifted in the positive (+) direction by the first channel portion 130n1, and the threshold voltage may be shifted in the negative (−) direction by the second channel portion 130n2. As a result, the thin film transistor 100 according to one example of the present disclosure may have a large s-factor as shown in FIG. 5B.

Hereinafter, the display devices according to another example of the present disclosure will be described. The display devices according to another example of the present disclosure may include the above-described thin film transistors 100, 200, 300, and 400.

Figure 6:
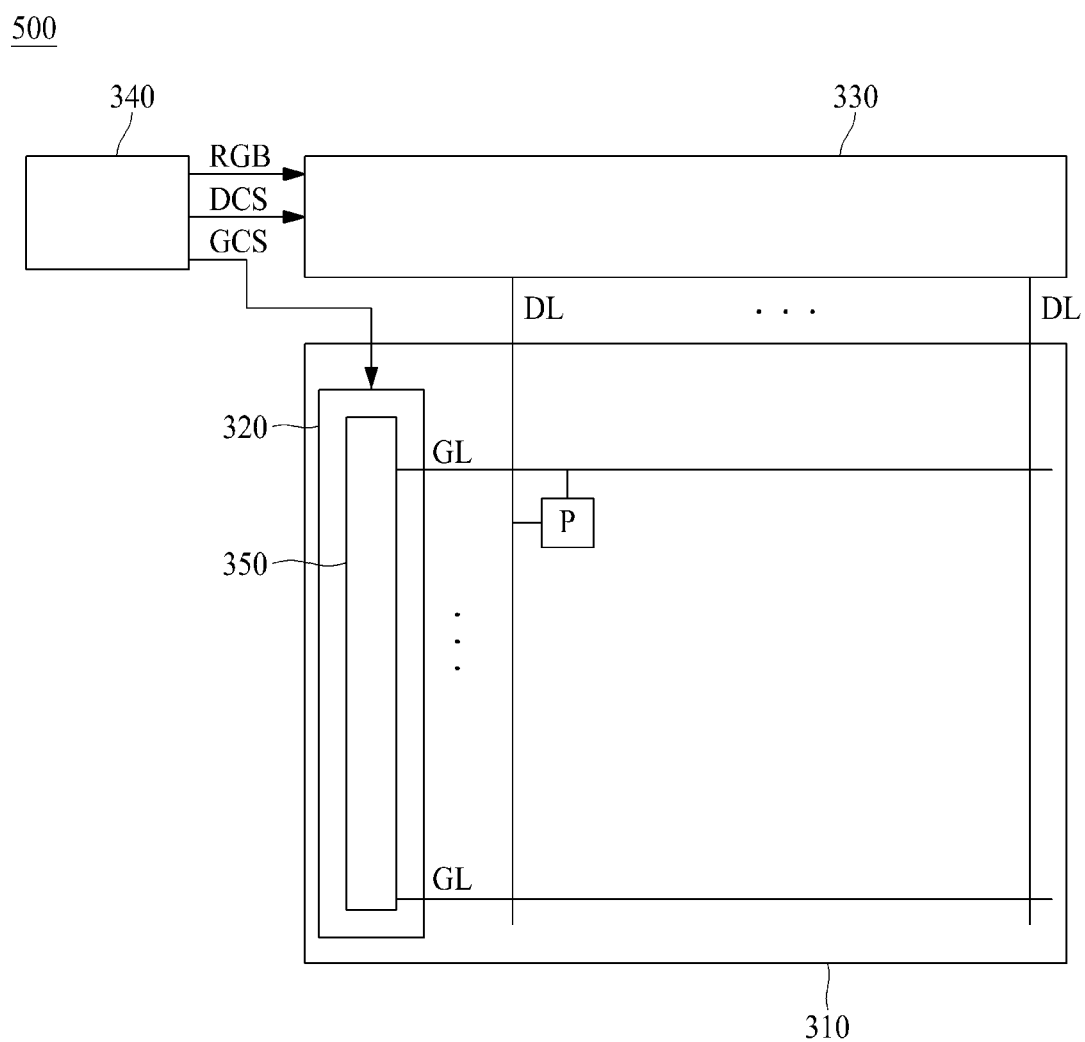
FIG. 6 is a schematic view illustrating a display device according to another example of the present disclosure.

FIG. 6 is a schematic view illustrating a display device 500 according to another example of the present disclosure.

As shown in FIG. 6, the display device 500 according to another example of the present disclosure includes a display panel 310, a gate driver 320, a data driver 330 and a controller 340.

Gate lines GL and data lines DL are disposed in the display panel 310, and pixels P are disposed in intersection areas of the gate lines GL and the data lines DL. An image is displayed by driving of the pixels P.

The controller 340 controls the gate driver 320 and the data driver 330.

The controller 340 outputs a gate control signal GCS for controlling the gate driver 320 and a data control signal DCS for controlling the data driver 330 by using a signal supplied from an external system (not shown). Also, the controller 340 samples input image data input from the external system, realigns the sampled data and supplies the realigned digital image data RGB to the data driver 330.

The gate control signal GCS includes a gate start pulse GSP, a gate shift clock GSC, a gate output enable signal GOE, a start signal Vst and a gate clock GCLK. Also, control signals for controlling a shift register may be included in the gate control signal GCS.

The data control signal DCS includes a source start pulse SSP, a source shift clock signal SSC, a source output enable signal SOE and a polarity control signal POL.

The data driver 330 supplies a data voltage to the data lines DL of the display panel 310. In detail, the data driver 330 converts the image data RGB input from the controller 340 into an analog data voltage, and supplies the data voltage to the data lines DL.

The gate driver 320 may include a shift register 350.

The shift register 350 sequentially supplies gate pulses to the gate lines GL for one frame by using the start signal and the gate clock, which are transmitted from the controller 340. In this case, one frame means a time period when one image is output through the display panel 310. The gate pulse has a turn-on voltage capable of turning on a switching element (thin film transistor) disposed in the pixel P.

Also, the shift register 350 supplies a gate-off signal capable of turning off a switching element, to the gate line GL for the other period of one frame, at which the gate pulse is not supplied. Hereinafter, the gate pulse and the gate-off signal will be collectively referred to as a scan signal SS or Scan.

According to one example of the present disclosure, the gate driver 320 may be packaged on the base substrate 110. In this way, a structure in which the gate driver 320 is directly packaged on the base substrate 110 will be referred to as a Gate In Panel (GIP) structure.

Figure 7:
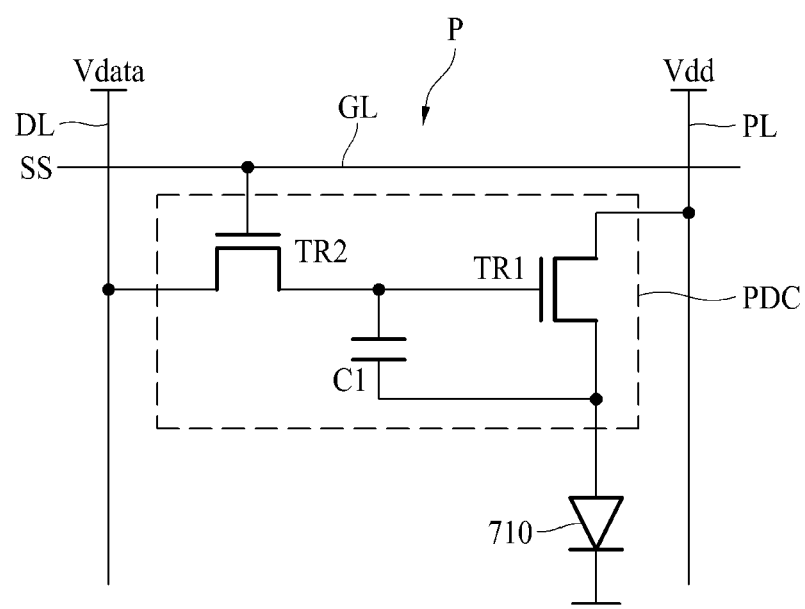
FIG. 7 is a circuit diagram illustrating any one pixel of FIG. 6 according to an embodiment of the present disclosure.
Figure 8:
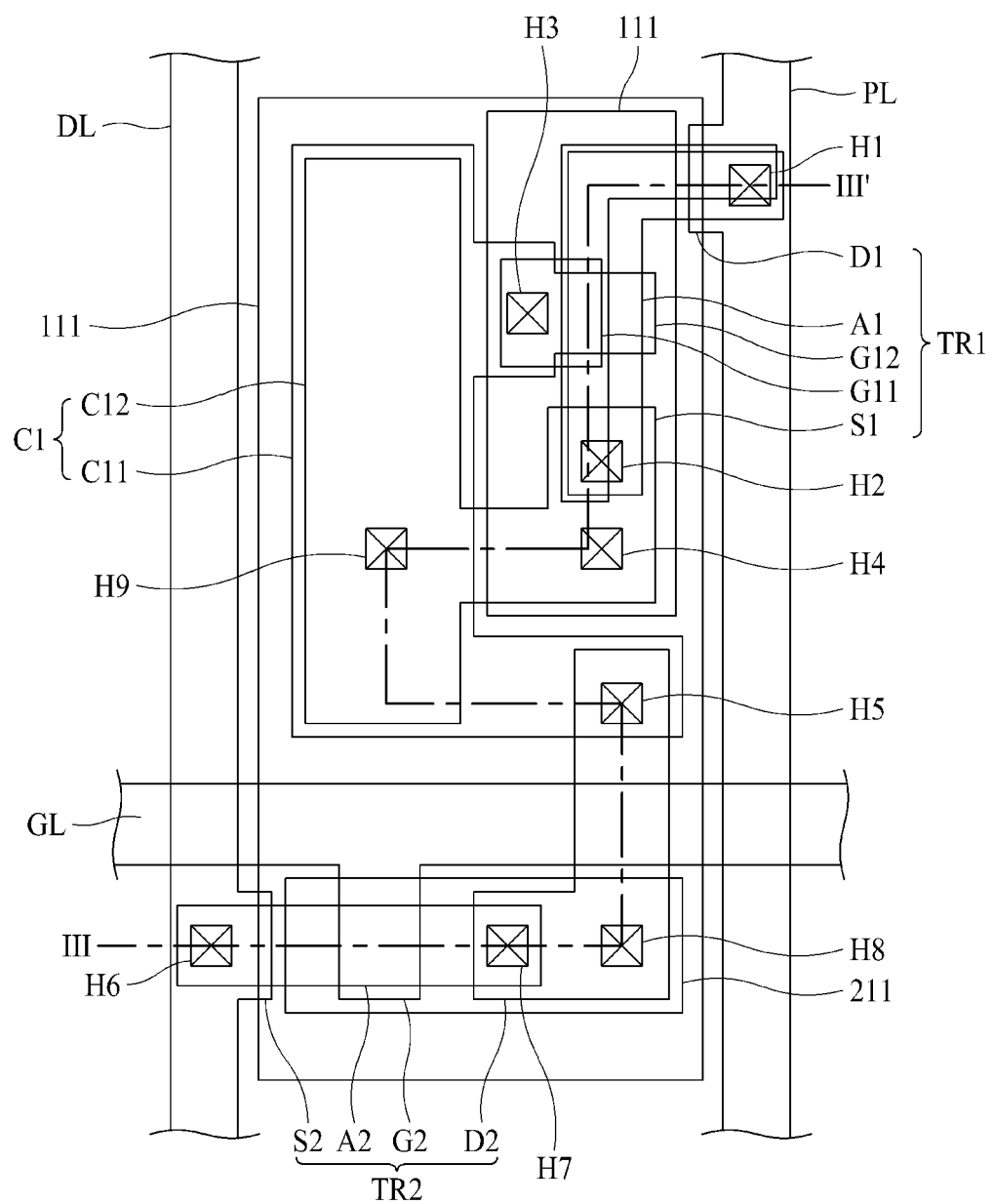
FIG. 8 is a plan view illustrating a pixel of FIG. 7 according to an embodiment of the present disclosure.
Figure 9:
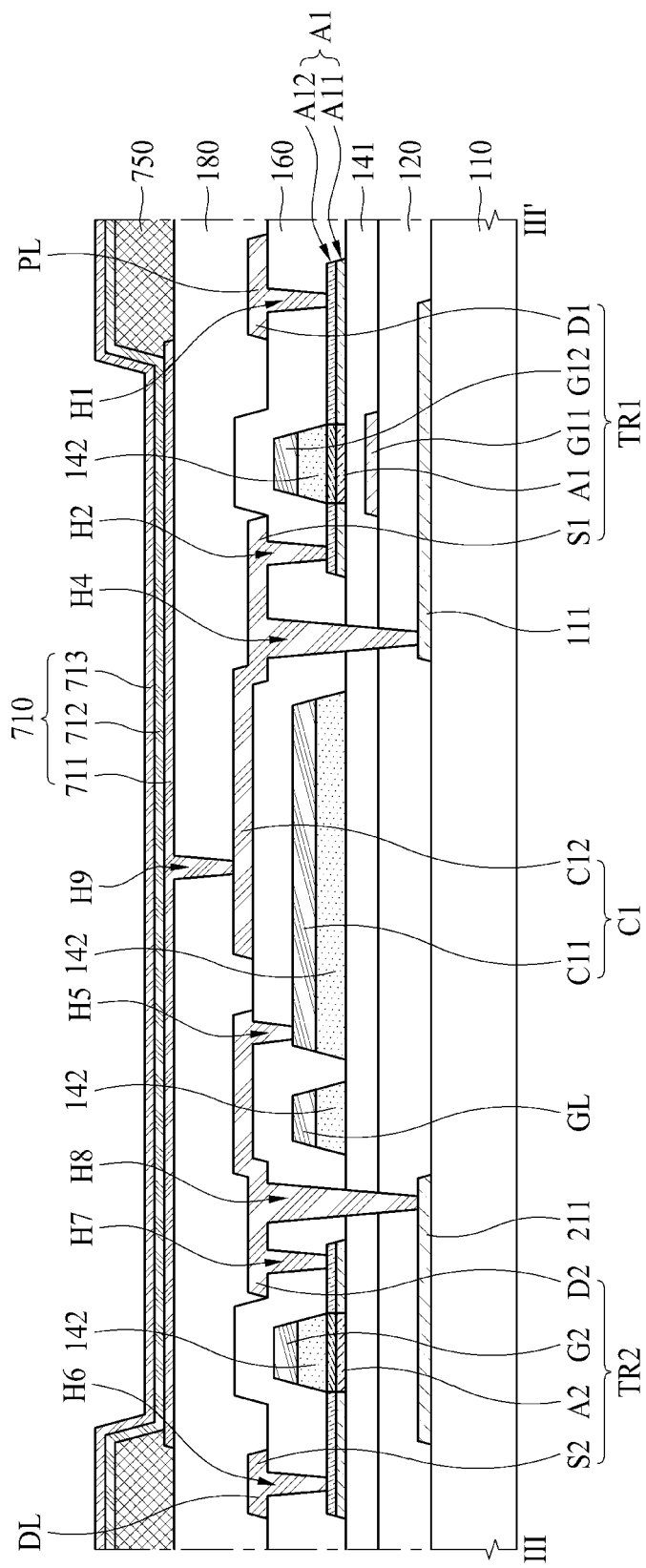
FIG. 9 is a cross-sectional view taken along line III-III' of FIG. 8 according to an embodiment of the present disclosure.

FIG. 7 is a circuit diagram illustrating any one pixel P of FIG. 6, FIG. 8 is a plan view illustrating a pixel P of FIG. 7, and FIG. 9 is a cross-sectional view taken along line III-III' of FIG. 8.

The circuit diagram of FIG. 7 is an equivalent circuit diagram for the pixel P of the display device 500 that includes an organic light emitting diode (OLED) as a display element 710. The pixel P includes a display element 710 and a pixel driving circuit PDC for driving the display element 710.

According to another example of the present disclosure, the display device 500 includes a pixel driving circuit PDC and a display element 710. The pixel driving circuit PDC includes a first thin film transistor TR1 and a second thin film transistor TR2. Any one of the thin film transistors 100, 200, 300 and 400 described as above may be used as the first thin film transistor TR1.

According to another example of the present disclosure, the first thin film transistor TR1 is a driving transistor, and the second thin film transistor TR2 is a switching transistor.

The second thin film transistor TR2 is connected to the gate line GL and the data line DL, and is turned on or off by the scan signal SS supplied through the gate line GL.

The data line DL provides a data voltage Vdata to the pixel driving circuit PDC, and the second thin film transistor TR2 controls applying of the data voltage Vdata.

A driving power line PL provides a driving voltage Vdd to the display element 710, and the first thin film transistor TR1 controls the driving voltage Vdd. The driving voltage Vdd is a pixel driving voltage for driving the organic light emitting diode (OLED) that is the display element 710.

When the second thin film transistor TR2 is turned on by the scan signal SS applied from the gate driver 320 through the gate line GL, the data voltage Vdata supplied through the data line DL is supplied to a gate electrode G11 and G12 of the first thin film transistor TR1 connected with the display element 710. The data voltage Vdata is charged in a storage capacitor C1 formed between the gate electrode G11 and G12 and a source electrode S1 of the first thin film transistor TR1.

The amount of a current supplied to the organic light emitting diode (OLED), which is the display element 710, through the first thin film transistor TR1 is controlled in accordance with the data voltage Vdata, whereby a gray scale of light emitted from the display element 710 may be controlled.

Referring to FIGS. 8 and 9, the first thin film transistor TR1 and the second thin film transistor TR2 are disposed on the base substrate 110.

The base substrate 110 may be made of glass or plastic. Plastic having a flexible property, for example, polyimide (PI) may be used as the base substrate 110.

Light shielding layers 111 and 211 are disposed on the base substrate 110. The light shielding layers 111 and 211 may shield light incident from the outside to protect the active layers A1 and A2.

A buffer layer 120 is disposed on the light shielding layers 111 and 211. The buffer layer 120 is made of an insulating material, and protects the active layers A1 and A2 from external water or oxygen.

A first gate electrode G11 of the first thin film transistor TR1 is disposed on the buffer layer 120. The second thin film transistor TR2 may not include a gate electrode disposed on the same layer as the first gate electrode G11 of the first thin film transistor TR1.

A gate insulating layer 141 is disposed on the first gate electrode G11.

The active layer A1 of the first thin film transistor TR1 and the active layer A2 of the second thin film transistor TR2 are disposed on the first gate insulating layer 141. For example, the active layers A1 and A2 may include an oxide semiconductor material. The active layers A1 and A2 may be made of an oxide semiconductor layer made of an oxide semiconductor material.

The active layer A1 of the first thin film transistor TR1 includes a first active layer A11 and a second active layer A12. The first active layer A11 and the second active layer A12 are disposed to overlap each other. The first active layer A11 may be made of a material having mobility lower than that of the second active layer A12. For example, the second active layer A12 may have mobility higher than that of the first active layer A11 as much as twice or more.

The first active layer A11 may be made of a low mobility oxide semiconductor material. The second active layer A12 may be made of a high mobility oxide semiconductor material. The second A width of the second active layer A12 is greater than a width w11 of the first active layer A11. The first active layer A11 may have a width sufficient to cover at least the first gate electrode G11 in an area overlapped with the second gate electrode G12.

The active layer A2 of the second thin film transistor TR2 may include at least one of an active layer made of the same material as that of the first active layer A11 of the first thin film transistor Tr1 or an active layer made of the same material as that of the second active layer A12 of the first thin film transistor TR1. In FIG. 9, the active layer A2 of the second thin film transistor TR2 includes both an active layer made of the same material as that of the first active layer A11 of the first thin film transistor TR1 and an active layer made of the same material as that of the second active layer A12 of the first thin film transistor TR1.

A second gate insulating layer 142 is disposed on the active layers A1 and A2.

A second gate electrode G12 of the first thin film transistor TR1 and a gate electrode G2 of the second thin film transistor TR2 are disposed on the second gate insulating layer 142.

Also, a gate line GL may be disposed on the second gate insulating layer 142. The gate electrode G2 of the second thin film transistor TR2 may be extended from the gate line GL, but one example of the present disclosure is not limited thereto, and a portion of the gate line GL may be the gate electrode G2 of the second thin film transistor TR2.

Referring to FIGS. 8 and 9, a first capacitor electrode C11 of the storage capacitor C1 is disposed on the second gate insulating layer 142. The first capacitor electrode C11 may be connected to the second gate electrode G12 of the first thin film transistor TR1. The first capacitor electrode C11 may be integrally formed with the second gate electrode G12 of the first thin film transistor TR1. Referring to FIG. 8, the first gate electrode G11 and the second gate electrode G12 of the first thin film transistor TR1 may be connected through a contact hole H3.

An interlayer insulating layer 160 is disposed on the second gate electrode G12 of the first thin film transistor TR1, the gate electrode G2 of the second thin film transistor TR2, the gate line GL, and the first capacitor electrode C11. The interlayer insulating layer 160 may be made of an organic or inorganic insulating material.

A source electrode S1 and a drain electrode D1 of the first thin film transistor TR1 are disposed on the interlayer insulating layer 160. The source electrode S1 of the first thin film transistor TR1 may be referred to as a first electrode 171, and the drain electrode D1 of the first thin film transistor TR1 may be referred to as a second electrode 172.

In addition, a source electrode S2 and a drain electrode D2 of the second thin film transistor TR2 are disposed on the interlayer insulating layer 160. The data line DL, the driving power line PL, and a second capacitor electrode C12 of the storage capacitor C1 may be disposed on the interlayer insulating layer 160.

A portion of the driving power line PL may be extended to become the drain electrode D1 of the first thin film transistor TR1. The drain electrode D1 of the first thin film transistor TR1 is connected to the active layer A1 through a contact hole H1.

The source electrode S1 of the first thin film transistor TR1 may be connected to the active layer A1 through a contact hole H2, and may be connected to the light shielding layer 111 through another contact hole H4.

The source electrode S1 of the first thin film transistor TR1 and the second capacitor electrode C12 are connected to each other. The source electrode S1 of the first thin film transistor TR1 and the second capacitor electrode C12 may be integrally formed.

A portion of the data line DL may be extended to become the source electrode S2 of the second thin film transistor TR2. The source electrode S2 of the second thin film transistor TR2 may be connected to the active layer A2 through a contact hole H6.

A drain electrode D2 of the second thin film transistor TR2 may be connected to the active layer A2 through a contact hole H7, may be connected to the first capacitor electrode C11 through another contact hole H5, and may be connected to the light shielding layer 211 through another contact hole H8.

A planarization layer 180 is disposed on the source electrode S1 and the drain electrode D1 of the first thin film transistor TR1, the source electrode S2 and the drain electrode D2 of the second thin film transistor TR2, the data line DL, the driving power line PL, and the second capacitor electrode C12.

The planarization layer 180 is made of an insulating layer, and planarizes upper portions of the first thin film transistor TR1 and the second thin film transistor TR2 and protects the first thin film transistor TR1 and the second thin film transistor TR2.

A first pixel electrode 711 of the display element 710 is disposed on the planarization layer 180. The first pixel electrode 711 is in contact with the second capacitor electrode C12 through a contact hole H9 formed in the planarization layer 180. As a result, the first pixel electrode 711 may be connected to the source electrode S1 of the first thin film transistor TR1.

A bank layer 750 is disposed at an edge of the first pixel electrode 711. The bank layer 750 defines a light emission area of the display element 710.

An organic light emitting layer 712 is disposed on the first pixel electrode 711, and a second pixel electrode 713 is disposed on the organic light emitting layer 712. Therefore, the display element 710 is completed. The display element 710 shown in FIGS. 8 and 9 is an organic light emitting diode OLED. Therefore, the display device 500 according to another example of the present disclosure is an organic light emitting display device.

Figure 10:
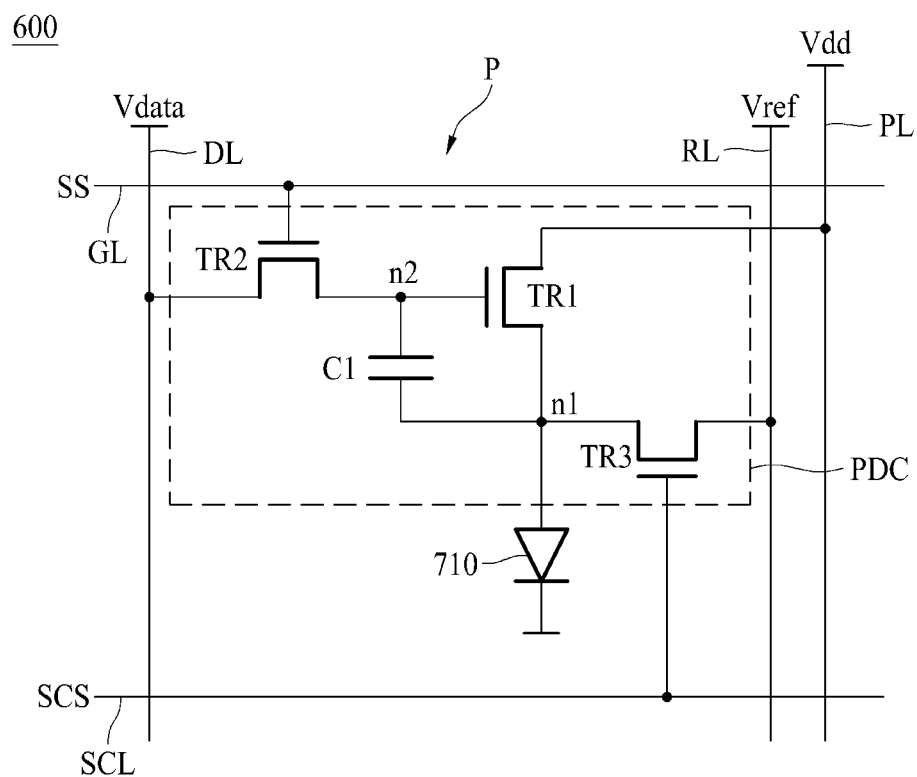
FIG. 10 is a circuit diagram illustrating any one pixel of a display device according to still another example of the present disclosure.

FIG. 10 is a circuit diagram illustrating any one pixel P of a display device 600 according to still another example of the present disclosure.

FIG. 10 is an equivalent circuit diagram illustrating a pixel P of an organic light emitting display device.

The pixel P of the display device 600 shown in FIG. 10 includes an organic light emitting diode (OLED) that is a display element 710 and a pixel driving circuit PDC for driving the display element 710. The display element 710 is connected with the pixel driving circuit PDC.

In the pixel P, signal lines DL, GL, PL, RL and SCL for supplying a signal to the pixel driving circuit PDC are disposed.

The data voltage Vdata is supplied to the data line DL, the scan signal SS is supplied to the gate line GL, the driving voltage Vdd for driving the pixel is supplied to the driving power line PL, a reference voltage Vref is supplied to a reference line RL, and a sensing control signal SCS is supplied to a sensing control line SCL.

The pixel driving circuit PDC includes, for example, a second thin film transistor TR2 (switching transistor) connected with the gate line GL and the data line DL, a first thin film transistor TR1 (driving transistor) for controlling a magnitude of a current output to the display element 710 in accordance with the data voltage Vdata transmitted through the second thin film transistor TR2, and a third thin film transistor TR3 (reference transistor) for sensing characteristics of the first thin film transistor TR1.

The storage capacitor C1 is positioned between the gate electrode of the first thin film transistor TR1 and the display element 710.

The second thin film transistor TR2 is turned on by the scan signal SS supplied to the gate line GL to transmit the data voltage Vdata, which is supplied to the data line DL, to the gate electrode of the first thin film transistor TR1.

The third thin film transistor TR3 is connected to a first node n1 between the first thin film transistor TR1 and the display element 710 and the reference line RL, and thus is turned on or off by the sensing control signal SCS and senses characteristics of the first thin film transistor TR1, which is a driving transistor, for a sensing period.

A second node n2 connected with the gate electrode of the first thin film transistor TR1 is connected with the second thin film transistor TR2. The storage capacitor C1 is formed between the second node n2 and the first node n1.

When the second thin film transistor TR2 is turned on, the data voltage Vdata supplied through the data line DL is supplied to the gate electrode of the first thin film transistor TR1. The data voltage Vdata is charged in the storage capacitor C1 formed between the gate electrode and the source electrode of the first thin film transistor TR1.

When the first thin film transistor TR1 is turned on, the current is supplied to the display element 710 through the first thin film transistor TR1 in accordance with the driving voltage Vdd for driving the pixel, whereby light is output from the display element 710.

Figure 11:
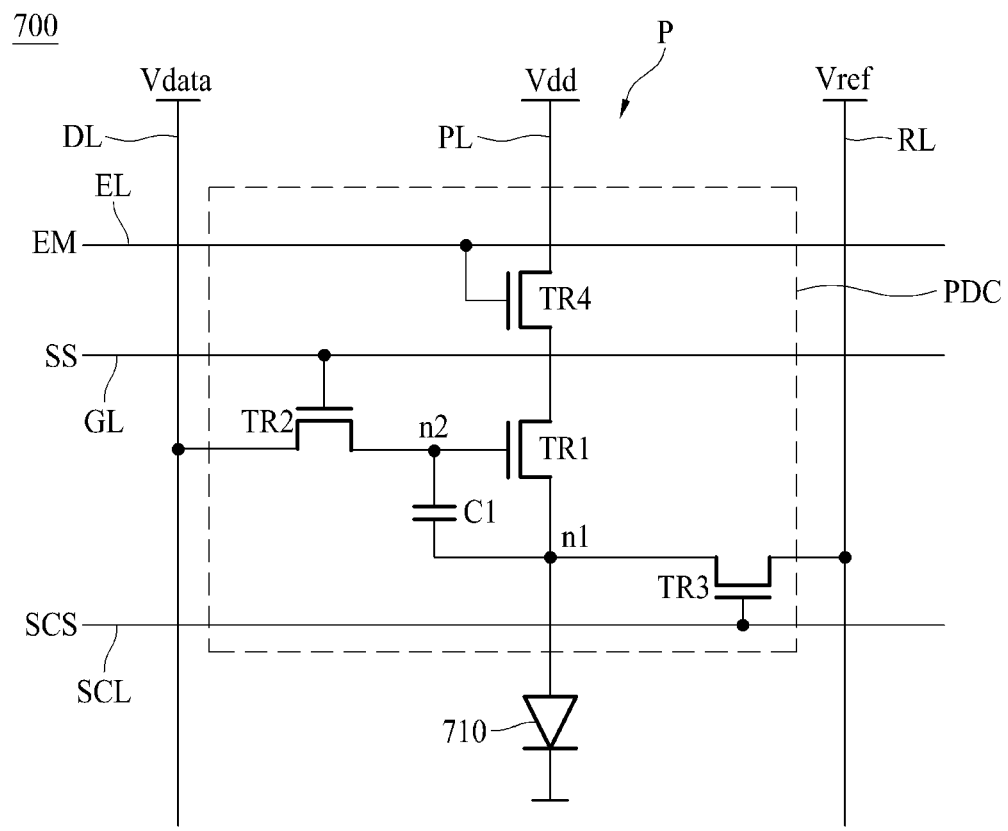
FIG. 11 is a circuit diagram illustrating any one pixel of a display device according to further still another example of the present disclosure.

FIG. 11 is a circuit diagram illustrating a pixel of a display device 700 according to further still another example of the present disclosure.

The pixel P of the display device 700 shown in FIG. 11 includes an organic light emitting diode (OLED) that is a display element 710 and a pixel driving circuit PDC for driving the display element 710. The display element 710 is connected with the pixel driving circuit PDC.

The pixel driving circuit PDC includes thin film transistors TR1, TR2, TR3 and TR4.

In the pixel P, signal lines DL, EL, GL, PL, SCL and RL for supplying a driving signal to the pixel driving circuit PDC are disposed.

In comparison with the pixel P of FIG. 10, the pixel P of FIG. 11 further includes an emission control line EL. An emission control signal EM is supplied to the emission control line EL.

Also, the pixel driving circuit PDC of FIG. 11 further includes a fourth thin film transistor TR4 that is an emission control transistor for controlling a light emission timing of the first thin film transistor TR1, in comparison with the pixel driving circuit PDC of FIG. 10.

The storage capacitor C1 is positioned between the gate electrode of the first thin film transistor TR1 and the display element 710.

The second thin film transistor TR2 is turned on by the scan signal SS supplied to the gate line GL to transmit the data voltage Vdata, which is supplied to the data line DL, to the gate electrode of the first thin film transistor TR1.

The third thin film transistor TR3 is connected to the reference line RL, and thus is turned on or off by the sensing control signal SCS and senses characteristics of the first thin film transistor TR1, which is a driving transistor, for a sensing period.

The fourth thin film transistor TR4 transfers the driving voltage Vdd to the first thin film transistor TR1 in accordance with the emission control signal EM or shields the driving voltage Vdd. When the fourth thin film transistor TR4 is turned on, a current is supplied to the first thin film transistor TR1, whereby light is output from the display element 710.

The pixel driving circuit PDC according to further still another example of the present disclosure may be formed in various structures in addition to the above-described structure. The pixel driving circuit PDC may include, for example, five or more thin film transistors.

According to the present disclosure, the following advantageous effects may be obtained.

In the thin film transistor according to one example of the present disclosure, the channel portion has a selective double active layer structure and also has a selective double gate structure, whereby the s-factor of the thin film transistor may be improved.

According to one example of the present disclosure, since the channel portion has a high mobility semiconductor portion and a portion where a high mobility semiconductor and a low mobility semiconductor overlap each other, negative (−) shift and positive (+) shift of the threshold voltage may simultaneously occur in one channel portion, whereby the s-factor of the thin film transistor may be improved.

In the display device according to one example of the present disclosure, the thin film transistor having a large s-factor and at the same time having excellent ON-current characteristics is used as the driving transistor, whereby excellent gray scale expression capability and excellent current characteristics may be obtained.

It will be apparent to those skilled in the art that the present disclosure described above is not limited by the above-described examples and the accompanying drawings and that various substitutions, modifications and variations can be made in the present disclosure without departing from the scope of the disclosures. Consequently, the scope of the present disclosure is defined by the accompanying claims and it is intended that all variations or modifications derived from the meaning, scope and equivalent concept of the claims fall within the scope of the present disclosure.

The present disclosure also includes a number of examples according to the following numbered clauses.

Clause 1. A thin film transistor including a first gate electrode and a second gate electrode, which are spaced apart from each other to overlap each other; and an active layer disposed between the first gate electrode and the second gate electrode, including a first active layer and a second active layer, wherein the active layer includes: a channel portion; a first connection portion that is in contact with one side of the channel portion; and a second connection portion that is in contact with the other side of the channel portion, the channel portion includes a first channel portion and a second channel portion, which are disposed in parallel, the first channel portion and the second channel portion are extended from the first connection portion to the second connection portion, respectively, the first channel portion overlaps the first gate electrode and the second gate electrode, the second channel portion does not overlap the first gate electrode, and overlaps the second gate electrode, the second active layer is disposed in the first channel portion and the second channel portion, and the first active layer is made of a material having mobility lower than that of the second active layer, and is not disposed in at least a portion of the second channel portion.

Clause 2. The thin film transistor of clause 1, wherein the first active layer is disposed between the first gate electrode and the second active layer.

Clause 3. The thin film transistor of clause 1 or clause 2, wherein the second active layer has mobility higher than that of the first active layer as much as twice or more.

Clause 4. The thin film transistor of claim 1, wherein the first active layer includes a gallium (Ga)-based oxide semiconductor material.

Clause 5. The thin film transistor of any preceding clause, wherein the first active layer includes at least one of an IGZO (InGaZnO)-based oxide semiconductor material [Ga concentration≥In concentration], a GZO (GaZnO)-based oxide semiconductor material, an IGO (InGaO)-based oxide semiconductor material, an IGZTO (InGaZnSnO)-based oxide semiconductor material or a GZTO (GaZnSnO)-based oxide semiconductor material.

Clause 6. The thin film transistor of any preceding clause, wherein the second active layer includes at least one of an IGZO (InGaZnO)-based oxide semiconductor material [Ga concentration<In concentration], an IZO (InZnO)-based oxide semiconductor material, an ITZO (InSnZnO)-based oxide semiconductor material, a FIZO (FeInZnO)-based semiconductor material, a ZnO-based oxide semiconductor material, a SIZO(SiInZnO)-based oxide semiconductor material, or a ZnON (Zn-Oxynitride)-based oxide semiconductor material.

Clause 7. The thin film transistor of any preceding clause, wherein the first active layer covers the entire first gate electrode in an area overlapped with the channel portion.

Clause 8. The thin film transistor of any preceding clause, wherein the first active layer is not disposed in the second channel portion.

Clause 9. The thin film transistor of any preceding clause, wherein a surface of the second active layer, which faces the first gate electrode, is fully covered by the first active layer in the channel portion.

Clause 10. The thin film transistor of any preceding clause, wherein a ratio of a width of the first channel portion to a width of the second channel portion ranges from 3:7 to 7:3.

Clause 11. The thin film transistor of any preceding clause, wherein the second active layer includes: a first oxide semiconductor layer; and a second oxide semiconductor layer on the first oxide semiconductor layer.

Clause 12. A display device including a pixel driving circuit; and a display element connected to the pixel driving circuit, wherein the pixel driving circuit includes a first thin film transistor and a second thin film transistor, and the first thin film transistor is the thin film transistor of any preceding clause.

Clause 13. The display device of clause 12, wherein the second thin film transistor includes at least one of an active layer made of the same material as that of the first active layer or an active layer made of the same material as that of the second active layer.

Clause 14. The display device of clause 12 and/or clause 13, wherein the second thin film transistor includes a gate electrode disposed on the same layer as the second gate electrode, and does not include a gate electrode disposed on the same layer as the first gate electrode.

Clause 15. The display device according to any of clauses 12 to 14, wherein the first thin film transistor is a driving transistor, and the second thin film transistor is a switching transistor.

What is claimed is:

1. A thin film transistor comprising:
a first gate electrode and a second gate electrode which overlap each other, and are spaced apart from each other in a thickness direction of the thin film transistor; and
an active layer disposed between the first gate electrode and the second gate electrode, the active layer comprising a first active layer and a second active layer,
wherein the active layer includes:
a channel portion;
a first connection portion that is in contact with one side of the channel portion; and
a second connection portion that is in contact with another side of the channel portion,
wherein the channel portion includes a first channel portion and a second channel portion, which are disposed side-by-side in plan view, each of the first channel portion and the second channel portion extend from the first connection portion to the second connection portion,
the first channel portion overlaps with the first gate electrode and with the second gate electrode,
the second channel portion overlaps with the second gate electrode, and
the second active layer is disposed in the first channel portion and the second channel portion, and
the first active layer is made of a material having a mobility lower than a mobility of a material of the second active layer, and is not disposed in at least a portion of the second channel portion.

2. The thin film transistor of claim 1, wherein the second channel portion does not overlap with the first gate electrode.

3. The thin film transistor of claim 1, wherein the first active layer covers the first gate electrode in the channel portion.

4. The thin film transistor of claim 1, wherein the first active layer and the second active layer overlap with one other, and contact one another.

5. The thin film transistor according to claim 1, wherein the channel portion is defined as a portion of the active layer which overlaps with the second gate electrode.

6. The thin film transistor of claim 1, wherein the first active layer is disposed between the first gate electrode and the second active layer.

7. The thin film transistor of claim 1, wherein the second active layer has the mobility higher than the mobility of the first active layer.

8. The thin film transistor of claim 1, wherein the mobility of the second active layer is double the mobility of the first active layer.

9. The thin film transistor of claim 1, wherein the mobility of the second active layer is more than double the mobility of the first active layer.

10. The thin film transistor of claim 1, wherein the first active layer includes a gallium (Ga)-based oxide semiconductor material.

11. The thin film transistor of claim 1, wherein the first active layer includes at least one of an IGZO (InGaZnO)-based oxide semiconductor material that has a Ga concentration≥In concentration, a GZO (GaZnO)-based oxide semiconductor material, an IGO (InGaO)-based oxide semiconductor material, or a GZTO (GaZnSnO)-based oxide semiconductor material.

12. The thin film transistor of claim 1, wherein the second active layer includes at least one of an IGZO (InGaZnO)-based oxide semiconductor material that has a Ga concentration<In concentration, an IZO (InZnO)-based oxide semiconductor material, an ITZO (InSnZnO)-based oxide semiconductor material, an IGZTO (InGaZnSnO)-based oxide semiconductor material, a FIZO (FeInZnO)-based semiconductor material, a ZnO-based oxide semiconductor material, a SIZO(SiInZnO)-based oxide semiconductor material, or a ZnON (Zn-oxynitride)-based oxide semiconductor material.

13. The thin film transistor of claim 1, wherein the first active layer covers an entire first gate electrode in an area overlapped with the channel portion.

14. The thin film transistor of claim 1, wherein the first active layer is not disposed in the second channel portion.

15. The thin film transistor of claim 1, wherein a surface of the second active layer, which faces the first gate electrode, is fully covered by the first active layer in the channel portion.

16. The thin film transistor of claim 1, wherein a ratio of a width of the first channel portion to a width of the second channel portion ranges from 3:7 to 7:3.

17. The thin film transistor of claim 1, wherein the second active layer includes:
   a first oxide semiconductor layer; and
   a second oxide semiconductor layer on the first oxide semiconductor layer.

18. The thin film transistor of claim 1, wherein at least a portion of the first connection portion is conductive.

19. The thin film transistor of claim 1, wherein at least a portion of the second connection portion is conductive.

20. The thin film transistor according to claim 1, wherein the thin film transistor is disposed on a base substrate.

21. The thin film transistor of claim 20, wherein the base substrate comprises glass or polyamide.

22. A display device comprising:
   a pixel driving circuit; and
   a display element connected to the pixel driving circuit,
   wherein the pixel driving circuit includes a first thin film transistor and a second thin film transistor, and
   wherein the first thin film transistor is the thin film transistor of claim 1.

23. The display device of claim 22, wherein the second thin film transistor includes at least one of an active layer made of a same material as the material of the first active layer or an active layer made of a same material as the material of the second active layer.

24. The display device of claim 22, wherein the second thin film transistor includes a gate electrode disposed on a same layer as the second gate electrode, and does not include a gate electrode disposed on a same layer as the first gate electrode.

25. The display device according to claim 22, wherein the first thin film transistor is a driving transistor, and the second thin film transistor is a switching transistor.

* * * * *